United States Patent
Chen et al.

(10) Patent No.: US 11,056,440 B2
(45) Date of Patent: Jul. 6, 2021

(54) METHODS OF MANUFACTURING SEMICONDUCTOR DEVICE AND SEMICONDUCTOR DEVICE

(71) Applicant: TAIWAN SEMICONDUCTOR MANUFACTURING CO., LTD., Hsinchu (TW)

(72) Inventors: Ying-Hua Chen, Hsinchu (TW); Feng-Jia Shiu, Jhudong Township (TW); Wen-Chen Lu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/591,961

(22) Filed: Oct. 3, 2019

(65) Prior Publication Data

US 2020/0176390 A1 Jun. 4, 2020

Related U.S. Application Data

(60) Provisional application No. 62/774,135, filed on Nov. 30, 2018.

(51) Int. Cl.
| | | |
|---|---|---|
| *H01L 23/544* | (2006.01) | |
| *H01L 23/522* | (2006.01) | |
| *H01L 27/22* | (2006.01) | |
| *H01L 21/3105* | (2006.01) | |
| *H01L 21/02* | (2006.01) | |
| *H01L 27/24* | (2006.01) | |

(52) U.S. Cl.
CPC ...... *H01L 23/544* (2013.01); *H01L 21/02164* (2013.01); *H01L 21/02167* (2013.01); *H01L 21/31053* (2013.01); *H01L 23/5226* (2013.01); *H01L 27/226* (2013.01); *H01L 27/2463* (2013.01); *H01L 2223/54426* (2013.01)

(58) Field of Classification Search
CPC .......... H01L 23/5226; H01L 21/31053; H01L 21/02167; H01L 21/02164; H01L 27/2463
USPC .......................... 438/618, 666; 257/773.797
See application file for complete search history.

(56) References Cited

U.S. PATENT DOCUMENTS

2016/0293719 A1* 10/2016 Mihara ................ H01L 29/423
257/324

* cited by examiner

*Primary Examiner* — Thinh T Nguyen

(74) *Attorney, Agent, or Firm* — McDermott Will & Emery LLP

(57) ABSTRACT

In a method of manufacturing a semiconductor device, a first interlayer dielectric (ILD) layer is formed over a substrate, a CMP stop layer is formed over the first ILD layer, a trench opening is formed by patterning the CMP stop layer and the first ILD layer, an underlying first process mark is formed by forming a first conductive layer in the trench opening, a lower dielectric layer is formed over the underlying first process mark, a middle dielectric layer is formed over the lower dielectric layer, an upper dielectric layer is formed over the middle dielectric layer, a planarization operation is performed on the upper, middle and lower dielectric layers so that a part of the middle dielectric layer remains over the underlying first process mark, and a second process mark by the lower dielectric layer is formed by removing the remaining part of the middle dielectric layer.

20 Claims, 17 Drawing Sheets

METHODS OF MANUFACTURING SEMICONDUCTOR DEVICE AND SEMICONDUCTOR DEVICE

RELATED APPLICATION

This application claims priority to U.S. Provisional Patent Application No. 62/774,135 filed on Nov. 30, 2018, the entire disclosure of which is incorporated herein by reference.

BACKGROUND

Traditional planar thin film devices provide superior performance with low power consumption. To enhance the device controllability and reduce the substrate surface area occupied by the planar devices, the semiconductor industry has progressed into nanometer technology process nodes in pursuit of higher device density, higher performance, and lower costs. One of the key technologies for the nanometer technology process nodes is a planarization process, such as chemical mechanical polishing (CMP), performed on one or more layers formed by deposition. Therefore, improvement of the CMP process is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
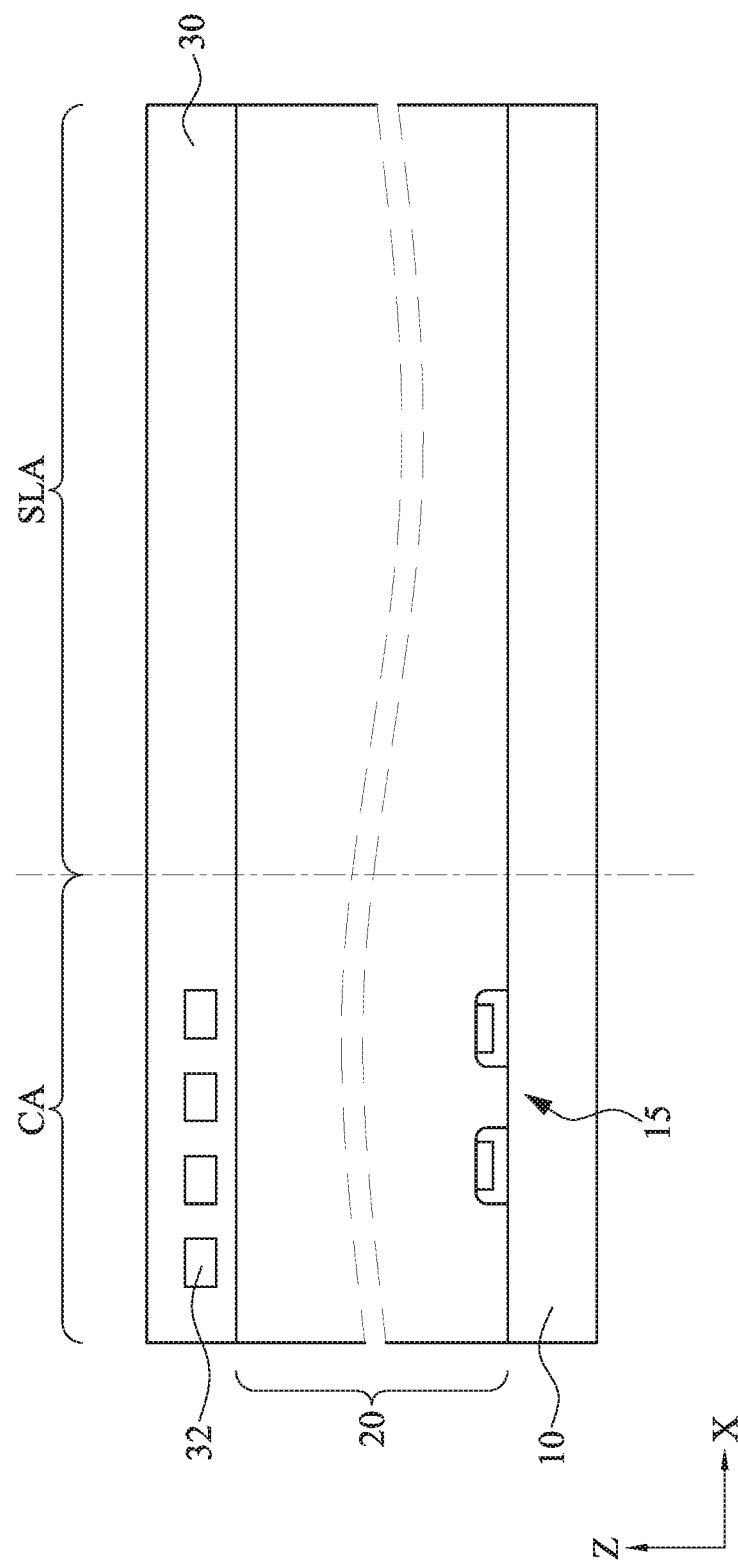
FIG. 1 shows a cross sectional view of a sequential manufacturing operation for a semiconductor device according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

During the manufacturing process of a semiconductor device, such as a field effect transistor (FET) device and a memory device, having topography, planarization of a surface is carried out to flatten an uneven surface so as to minimize defocus influence during a photo lithography operation. When a layer, for example a dielectric layer, a semiconductor layer and/or a conductive (e.g., metal) layer, is patterned by using lithography and etching operations, a photo resist layer is formed on the layer and the resist layer is exposed with an actinic radiation (e.g., deep ultra violet light) passing through or reflected by a photo mask having circuit patterns. The layer to be patterned may have an uneven surface or topography due to underlying structures. In such a case, the best focus for one height in one exposure process in the lithography operation is not the best focus (e.g., defocus) for other heights. As the circuit pattern to be pattered by the lithography operation becomes smaller, a focus tolerance (focus margin) also becomes smaller. Accordingly, it is generally necessary to flatten such an uneven surface to reduce the unevenness by a planarization operation, such as a chemical mechanical polishing (CMP) operation or an etch-back operation. A resist pattern for most fine circuit patterns is formed on a flattened or planarized surface.

On the other hand, a surface topography is necessary for some patterns. For example, an alignment mark used to align a photo mask to a circuit pattern already formed generally requires a topography. An alignment mark is read by a laser light of a lithography apparatus and the reflected laser light (alignment signal) is detected to determine the relative location of the alignment marks and then wafer alignment operation is performed by the lithography apparatus. When an alignment mark is covered by a layer and the surface of the layer is flat, the alignment signal becomes weak. In particular, if a light reflective material layer (e.g., a metallic layer) is formed over the alignment mark, detecting the alignment signal becomes very difficult.

The present disclosure provides methods and structures to solve the above-mentioned problem in a planarization operation and a lithography operation. In the present disclosure, an alignment mark, an overlay measurement mark or any other marks (patterns), which are not part of active circuit and used for the purpose of manufacturing process, may be referred to as a process mark.

FIGS. 1-12 show a sequential process for manufacturing a semiconductor device according to an embodiment of the present disclosure. It is understood that additional operations can be provided before, during, and after processes shown by FIGS. 1-12, and some of the operations described below can be replaced or eliminated, for additional embodiments of the method. The order of the operations/processes may be interchangeable.

In the following manufacturing operations, a circuit area CA and a peripheral area, such as a scribe lane area SLA, are processed to form a circuit pattern (e.g., a via hole or via contact) and an alignment mark is used to align a photo mask to a circuit pattern already formed.

As shown in FIG. 1, one or more first interlayer dielectric (ILD) layers 20 is formed over substrate 10. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 includes silicon germanium (SiGe) buffer layers epitaxially grown on the silicon substrate 10. The germanium concentration of the SiGe buffer layers may increase from about 30 atomic % germanium for the bottom-most buffer layer to about 70 atomic % germanium for the top-most buffer layer. In some embodiments of the present disclosure, the substrate 10 includes various regions that have been suitably doped with impurities (e.g., p-type or n-type conductivity).

In some embodiments, one or more electronic devices 15 are formed on the substrate 10. The electronic devices 15 include transistors, such as FETs, fin FETs, gate-all-around FETs, capacitors, or any other electronic devices.

The first ILD layer 20 covers the electronic devices 15 as shown in FIG. 1. The dielectric or insulating material for the first ILD layer 15 includes silicon oxide, silicon nitride, silicon oxynitride (SiON), silicon carbon nitride (SiCN), silicon carbon oxynitride (SiCON), silicon carbon oxide (SiOC), fluorine-doped silicate glass (FSG), or a low-k dielectric material. The first ILD layer 20 is formed by LPCVD (low pressure chemical vapor deposition), plasma-CVD, flowable CVD or any other suitable film formation methods. In some embodiments, the first ILD layer 20 includes multiple ILD layers and some of the multiple ILD layers include metal wirings and via contacts.

In some embodiments, a second ILD layer 30 is formed over the first ILD layer 20. The material of the second ILD layer 30 is the same as or similar to that of the first ILD layer 20. In some embodiments, one or more metal wiring layers 32 are disposed in the second ILD layer 30 in the circuit area CA. In some embodiments, the wiring layers 32 are made of Cu, W, Al, AlCu, Ti, Ta or alloy thereof. In some embodiments, the wiring layers 32 are coupled to the electronic devices 15, for example gates or source/drains of transistors, formed on the substrate 10 via one or more lower wiring layers and via contacts. In some embodiments, after the second ILD layer 32 is formed, a planarization operation, such as a CMP operation or an etch-back operation, is performed.

In FIGS. 2-12, the substrate 10, the electronic devices 15 and the first ILD layer 20 are omitted.

Figure 2:
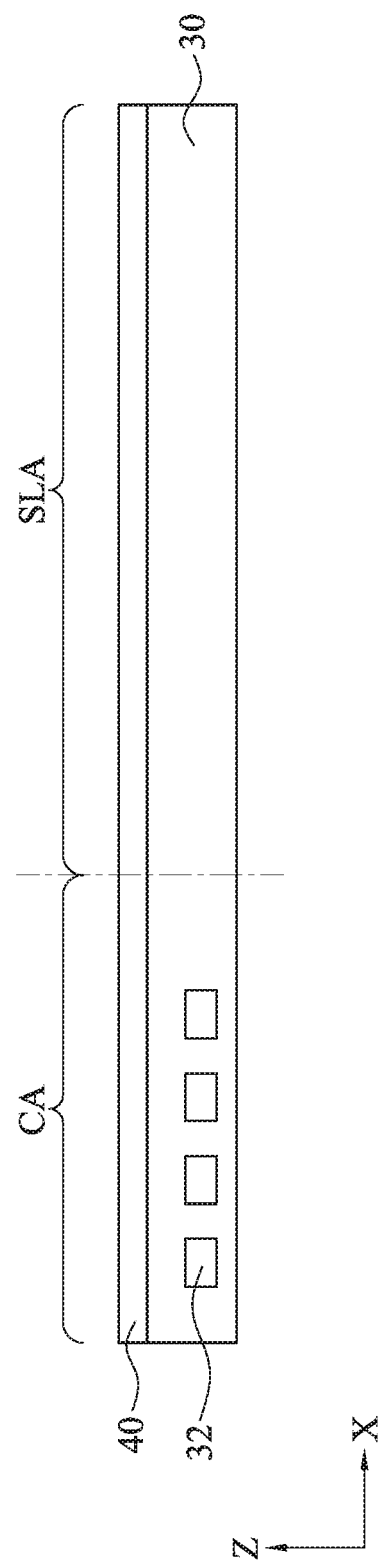
FIG. 2 shows a cross sectional view of a sequential manufacturing operation for a semiconductor device according to embodiments of the present disclosure.

As shown in FIG. 2, in some embodiments, a CMP stop layer 40 is deposited over the second ILD layer 30. The CMP stop layer 40 includes silicon-rich oxide, silicon carbide, or any other suitable material. The CMP stop layer 40 can be formed by CVD, atomic layer deposition (ALD) or any other suitable film formation methods. A thickness of the CMP stop layer 40 is in a range from about 20 nm to about 100 nm in some embodiments, and is in a range from about 40 nm to about 80 nm in other embodiments.

Figure 3:
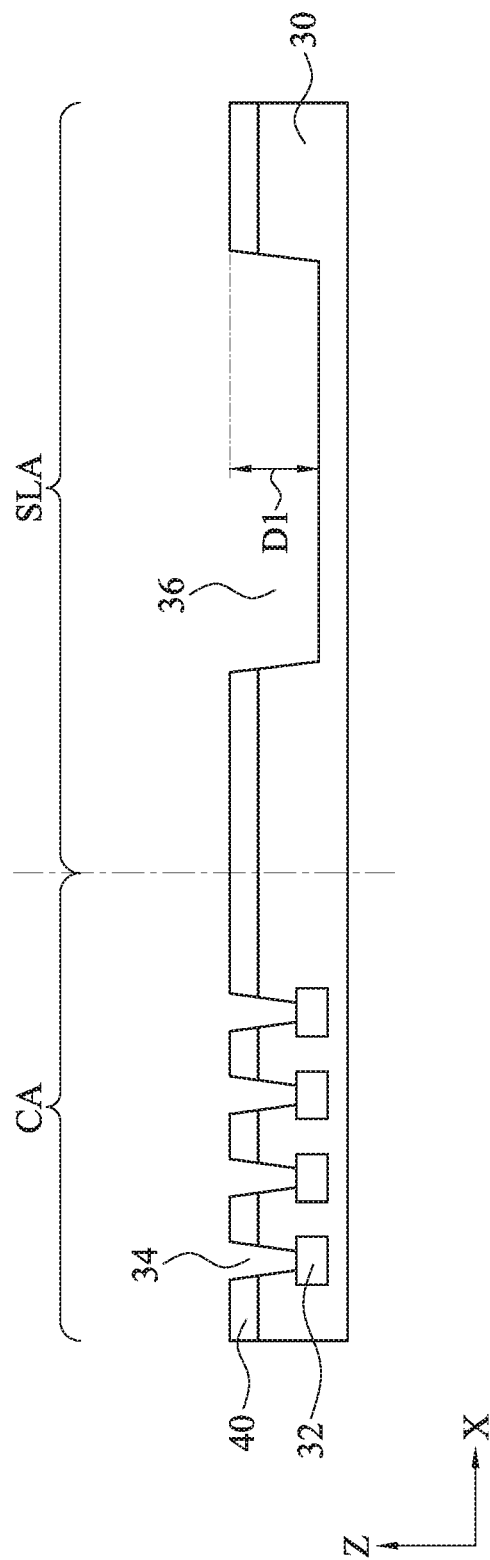
FIG. 3 shows a cross sectional view of a sequential manufacturing operation for a semiconductor device according to embodiments of the present disclosure.

Then, as shown in FIG. 3, the CMP stop layer 40 and the second ILD layer 30 are patterned by using one or more photo lithography operations. The photo lithography operation includes a deep ultra violet (DUV) lithography operation or an EUV (extreme UV) lithography operation. In certain embodiments, electron beam lithography is used instead of or in addition to the photo lithography operation. In the circuit area CA, a plurality of holes or openings 34 are formed, and in the scribe lane area SLA, one or more trench openings 36 are formed. In some embodiments, the trench opening 36 corresponds to an alignment mark to be used in one or more subsequent lithography operations. In some embodiments, the trench opening 36 has a rectangular shape or a square shape in plan view having a dimension (width and/or length) in a range from about 0.1 μm to 10 μm. In some embodiments, a depth D1 of the trench opening 36 measured at the center of the trench opening 36 and from the upper surface of the CMP stop layer 40 is in a range from about 10 nm to about 100 nm, and is in a range from about 30 nm to about 50 nm in other embodiments. In the circuit area CA, the metal wirings 32 are disposed at the bottom of the openings 34.

Figure 4:
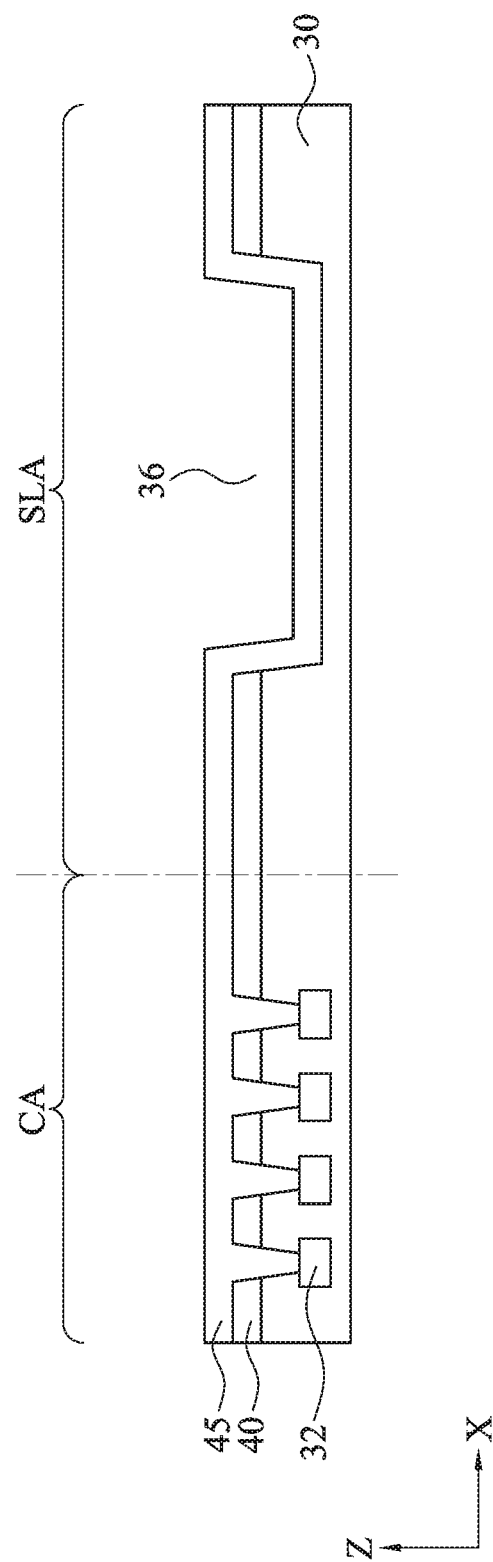
FIG. 4 shows a cross sectional view of a sequential manufacturing operation for a semiconductor device according to embodiments of the present disclosure.

As shown in FIG. 4, a first conductive layer 45 is formed in the circuit area CA and the scribe lane area SLA. The first conductive layer 45 includes one or more layers of copper, aluminum, titanium, tungsten, nickel, cobalt, tantalum and an alloy thereof, TiN and TaN in some embodiments. In certain embodiments, the first conductive layer 45 is a TiN layer.

The first conductive layer 45 can be formed by CVD, physical vapor deposition (PVD) including sputtering, electro-plating, ALD, or any other suitable film formation methods. A thickness of the first conductive layer 45 is in a range from about 20 nm to about 100 nm in some embodiments, and is in a range from about 30 nm to about 50 nm in other embodiments. As shown in FIG. 4, the first conductive layer 45 is conformally formed and does not fully fill the trench opening 36 in some embodiments. Thus, the first conductive layer 45 has a concave portion having a bottom portion and sidewall portions as shown in FIG. 4 in some embodiments. In the circuit area CA, the openings 34 are fully filled with the first conductive layer 45 due to the small dimension (e.g., diameter) of the opening 520.

Subsequently, one or more planarization operations are performed on the first conductive layer 45. In some embodiments, a CMP operation is performed on the first conductive layer 45 to remove a portion of the conductive layer 45 disposed on the CMP stop layer 40.

Figure 5:
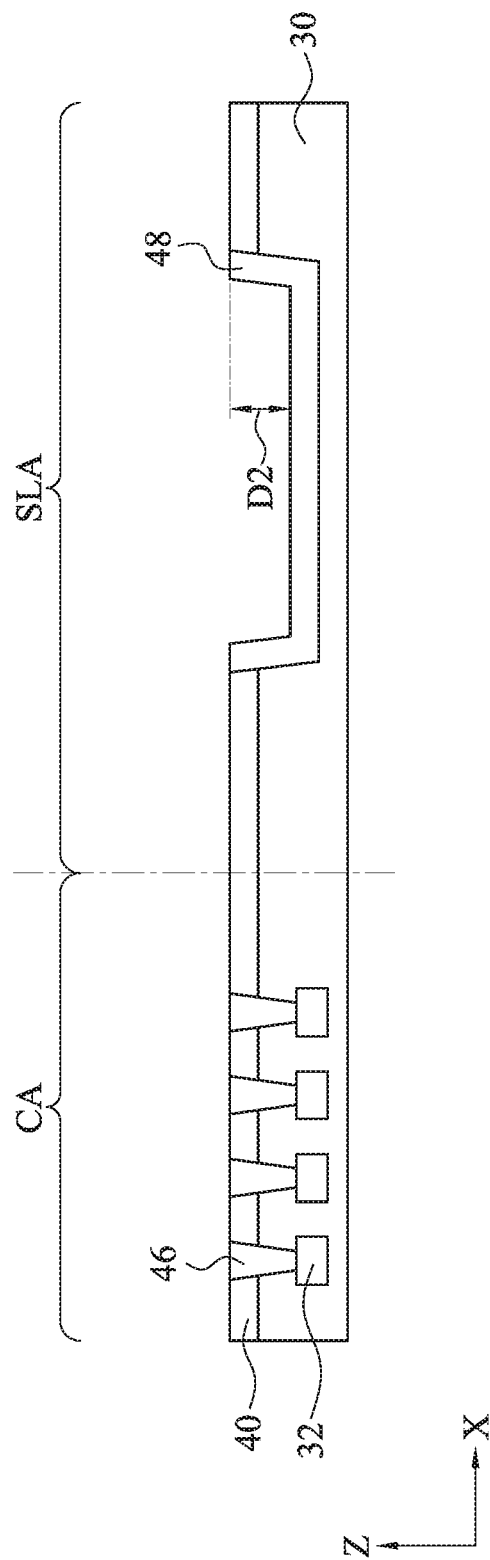
FIG. 5 shows a cross sectional view of a sequential manufacturing operation for a semiconductor device according to embodiments of the present disclosure.

FIG. 5 shows the result of the CMP operation. The CMP operation substantially stops on the CMP stop layer 40. In some embodiments, the CMP stop layer 40 is slightly etched and the etching of the CMP stop layer 40 is detected and then the CMP operation is stopped in response to the detection of the etching of the CMP stop layer 40. In other embodiments, exposing the CMP stop layer 40 is detected by, for example, an optical measurement, and the CMP operation is stopped in response to the detection of the exposure of the CMP stop layer 40.

As the result of the CMP operations, via contacts 46 are formed in the circuit area CA, and an underlying alignment mark 48 is formed in the scribe lane area SLA, as shown in FIG. 5. In some embodiments, a depth D2 of the underlying alignment mark 48 at the center of the underlying alignment mark 48 measured from the upper surface of the CMP stop layer 40 is in a range from about 20 nm to about 80 nm, and is in a range from about 30 nm to about 50 nm in other embodiments.

In some embodiments of the present disclosure, a memory cell structure is formed in the circuit area CA. In some embodiments, the memory cell structure includes a cross-point memory cell that includes a memory material disposed between a word line and a bit line and at the cross point of the word line and the bit line.

Figure 6:
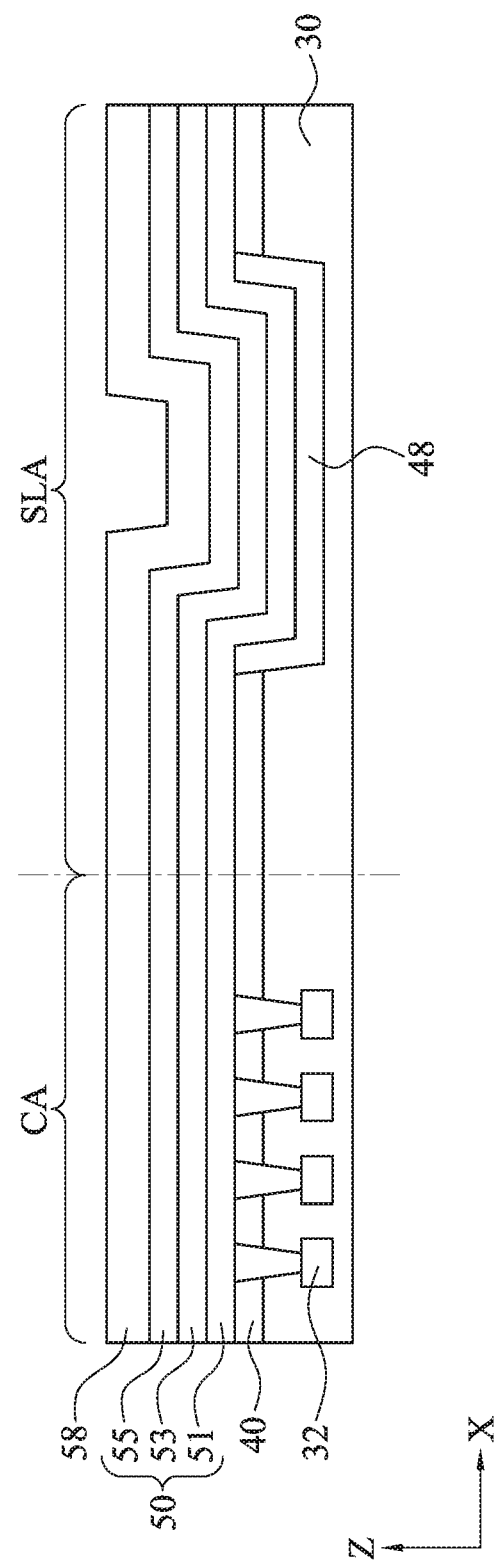
FIG. 6 shows a cross sectional view of a sequential manufacturing operation for a semiconductor device according to embodiments of the present disclosure.

In some embodiment, as shown in FIG. 6, a stacked layer 50 for a memory cell structure is formed over the structure shown in FIG. 5. In some embodiments, the stacked structure 50 includes a second conductive layer 51 for a word line, a memory layer 53 and a third conductive layer 55. In some embodiments, the second conductive layer 51 is made of Cu, W, Al, AlCu, Ti, Ta or alloy thereof. In certain embodiments, the second conductive layer 51 is made of W.

The memory layer 53 includes a memory material layer and a selector material layer in some embodiments. The memory material layer includes a phase change material, a resistive change material, ferroelectric material or a magnetic material, in some embodiments.

In some embodiments, the memory material layer includes a non-stoichiometric (e.g., oxygen deficient) metal oxide, such as $HfO_x$, $TiO_x$, $TaO_x$, $ZrO_x$, $WO_x$, $AlO_x$, $NbO_x$, $FeO_x$, $GeO_x$ or $GdO_x$, or a metal oxide, such as NiO, CeO, NiO, ZrO and CuO. In other embodiments, the memory material layer includes a binary phase change material, such as GeSb, InSb, InSe, SbTe, GeTe, and/or GaSb; a ternary system, such as GeSbTe, InSbTe, GaSeTe, SnSbTe, InSbGe, and/or GaSbTe; or a quaternary system, such as GeSnSbTe, GeSbSeTe, TeGeSbS, GeSbTeO, and/or GeSbTeN. In certain embodiments, the phase change material is a Ge—Sb—Te alloy (e.g., $Ge_2Sb_2Te_5$) with or without nitrogen doping and/or silicon oxide. In other embodiments, the memory material layer includes a ferroelectric material, such as, $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_2$, hafnium silicate, HfAlO, LaAlO, lanthanum oxide, $HfO_2$ doped with Si ($HfSiO_x$), or $Ta_2O_5$. In some embodiments, $PbZr_{0.5}Ti_{0.5}O_3$ or $Hf_{0.5}Zr_{0.5}O_2$ is used as the ferroelectric layer. In some embodiments, the selector material layer is not used. For example, a ferroelectric RAM (FRAM) does not utilize a selector material layer.

The thickness of the memory material layer is in a range from about 2 nm to about 10 nm in some embodiments, and is in a range from about 3 nm to about 5 nm in other embodiments. The memory material layer can be formed by ALD, CVD, or other suitable process.

In some embodiments, the selector material layer includes one or more materials selected from the group consisting of GeSe doped with one or more selected from the group consisting of N, P, S, Si and Te; AsGeSe doped with one or more selected from the group consisting of N, P, S, Si and Te; and AsGeSeSi doped with one or more selected from the group consisting of N, P, S, Si and Te. In other embodiments, the selector material layer is made of a material including $SiO_x$, $TiO_x$, $AlO_x$, $WO_x$, $Ti_xN_yO_z$, $HfO_x$, $TaO_x$, $NbO_x$, or the like, or suitable combinations thereof, where x, y and z are non-stoichiometric values. In certain embodiments, the selector material layer 240 is a chalcogenide or a solid-electrolyte material containing one or more of Ge, Sb, S, and Te. The thickness of the selector material layer is in a range from about 5 nm to about 20 nm in some embodiments, and is in a range from about 10 nm to about 14 nm in other embodiments. The selector material layer can be formed by ALD, CVD, or other suitable process. In some embodiments, the memory material layer is formed on the second conductive layer 51 and the selector material layer is formed on the memory material layer. In other embodiments, the selector material layer is formed on the second conductive layer 51 and the memory material layer is formed on the selector material layer.

The third conductive layer 55 includes TiN in some embodiments. The thickness of the third conductive layer 55 is in a range from about 2 nm to about 20 nm in some embodiments, and is in a range from about 5 nm to about 10 nm in other embodiments. The third conductive layer 55 can be formed by ALD, CVD, or other suitable process.

Further, as shown in FIG. 6, a hard mask layer 58 is formed over the third conductive layer 55. In some embodiments, the hard mask layer 58 is used as a hard mask layer for patterning the stacked layer 50. In some embodiments, the hard mask layer 58 includes a silicon nitride based material, such as silicon nitride or SiON. The thickness of the hard mask layer 58 is in a range from about 20 nm to about 100 nm in some embodiments, and is in a range from about 30 nm to about 70 nm in other embodiments. The hard mask layer 58 can be formed by ALD, CVD, or other suitable process. As shown in FIG. 6, in the scribe lane area SLA, the stacked layer 50 and the hard mask layer 58 are substantially conformally formed along the concave underlying alignment mark 48 in some embodiments.

Figure 7:
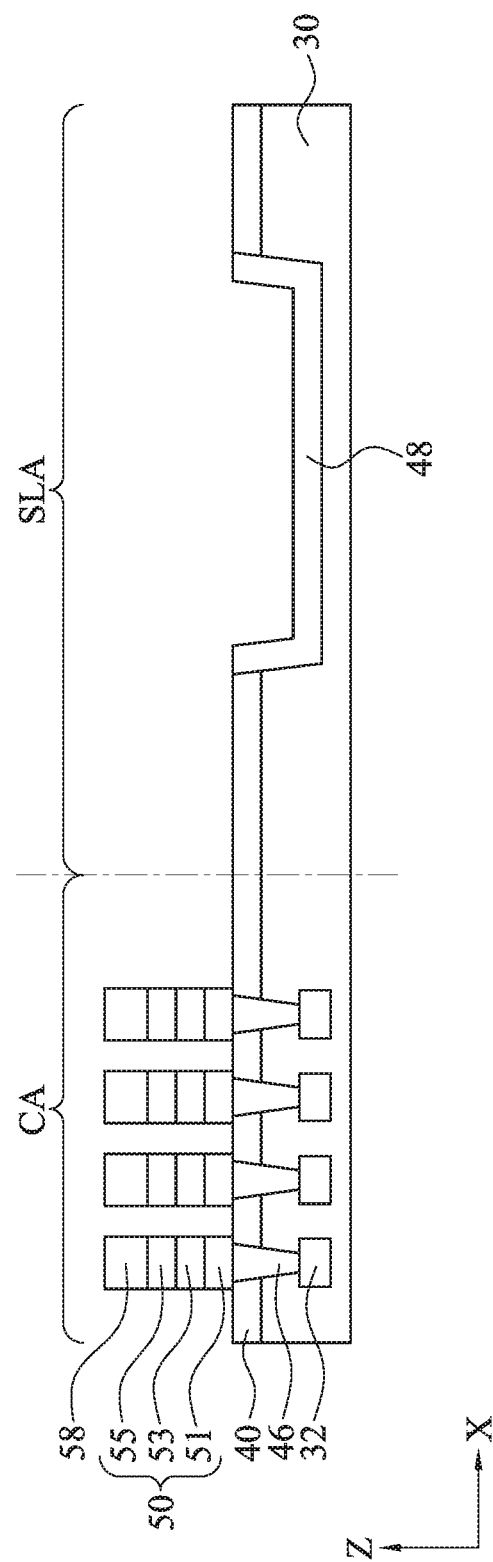
FIG. 7 shows a cross sectional view of a sequential manufacturing operation for a semiconductor device according to embodiments of the present disclosure.

Next, the hard mask layer 58 is patterned by using one or more lithography and etching operations, and then the stacked layer 50 is patterned into memory structures, as shown in FIG. 7. In some embodiments, the patterned memory structure extend in the Y direction forming word lines with memory layer thereon. In the scribe lane area SLA, the stacked layer 50 is fully removed so that the underlying alignment mark 48 is exposed, in some embodiments. In other embodiments, at least one layer of the stacked layer 50 remains over the underlying alignment mark 48.

Figure 8:
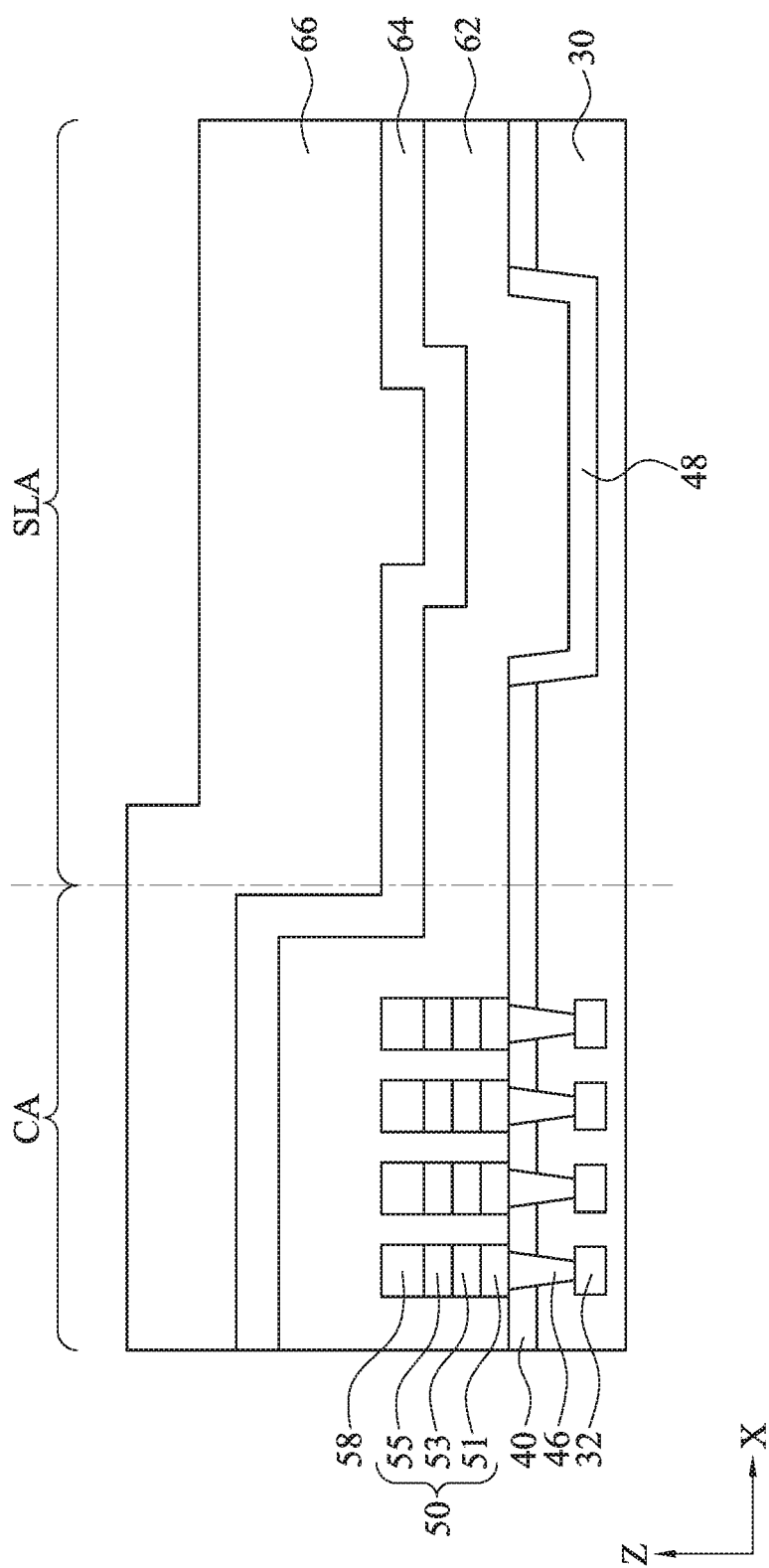
FIG. 8 shows a cross sectional view of a sequential manufacturing operation for a semiconductor device according to embodiments of the present disclosure.

After the memory structures are formed, a lower dielectric layer 62, a middle dielectric layer 64 and an upper dielectric layer 66 are sequentially formed, as shown in FIG. 8. In some embodiments, the lower and upper dielectric layers 62, 66 are made of a silicon oxide based material, such as silicon oxide or SiOC, and the middle dielectric layer is made of a silicon nitride based material, such as silicon nitride or SiON. The middle dielectric layer can be other materials that have a high selectivity with respect to silicon oxide. In some embodiments, the middle dielectric layer 62 is made of the same material as the hard mask layer 58 in the circuit area CA. In certain embodiments, the lower and upper dielectric layers 62, 66 are made of silicon oxide, and the middle dielectric layer is made of silicon nitride.

In some embodiments, the thickness of the lower dielectric layer 62 is such that the upper surface of the lower dielectric layer at the flat portion other than the memory structures and the underlying alignment mark 48 has a substantially equal height form the surface of the CMP stop layer 40 to the upper surface of the third conductive layer 55. The difference in height is in a range from less than 5 nm in some embodiments, and is less than about 3 nm in other embodiments.

In some embodiments, the middle dielectric layer 64 is substantially equal to the thickness of the hard mask layer 58 after patterning. The thickness of the middle dielectric layer 64 is in a range from about 20 nm to about 100 nm in some embodiments, and is in a range from about 30 nm to about 70 nm in other embodiments. In some embodiments, the thickness of the middle dielectric layer 64 and/or the thickness of the lower dielectric layer are adjusted such that the upper surface of the middle dielectric layer at the flat portion other than the memory structures and the underlying alignment mark 48 has a substantially equal height form the surface of the CMP stop layer 40 to the upper surface of the hard mask layer 58. The difference in height is in a range from less than 5 nm in some embodiments, and is less than about 3 nm in other embodiments.

In some embodiments, the thickness of the upper dielectric layer 66 is in a range from about 40 nm to about 200 nm in some embodiments, and is in a range from about 50 nm to about 150 nm in other embodiments.

As shown in FIG. 8, due to the topography caused by the underlying alignment mark 48, the middle dielectric layer 64 and the lower dielectric layer 62 have a concave portion above the underlying alignment mark 48.

Figure 9:
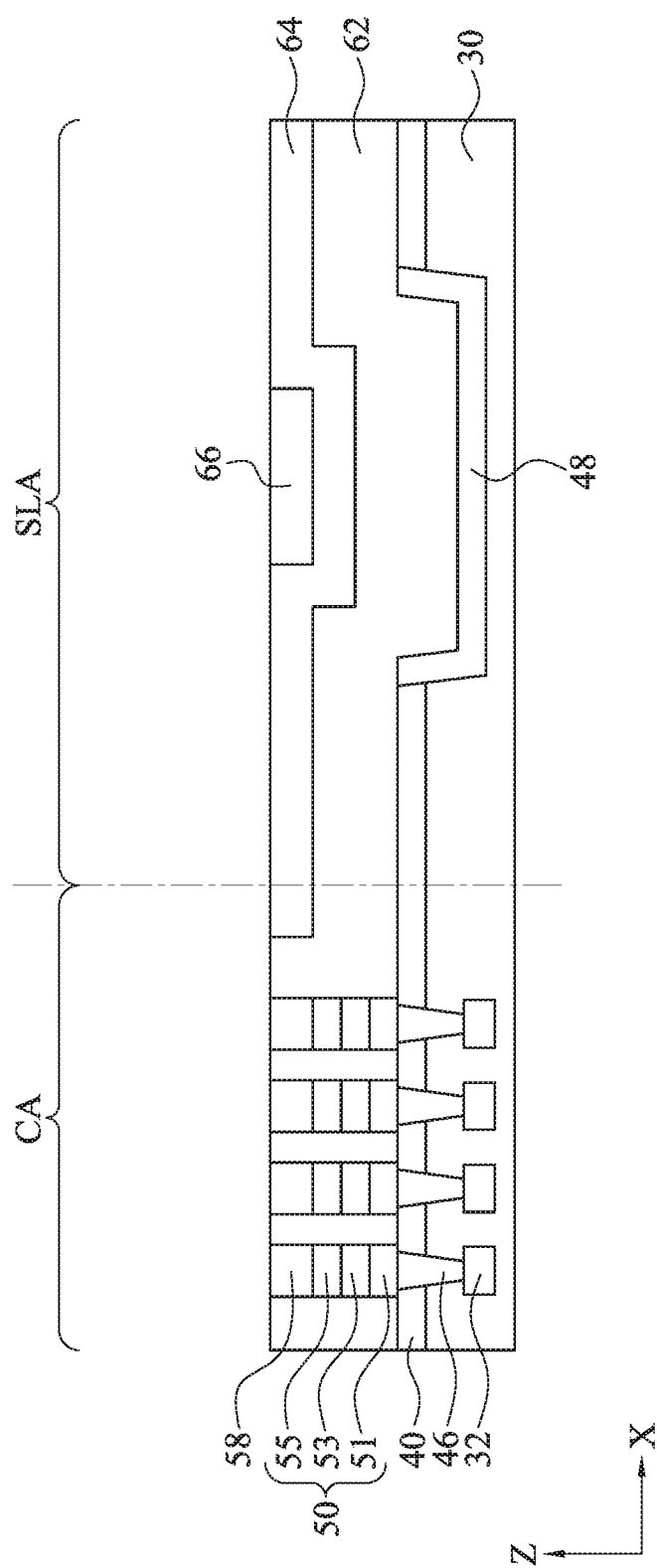
FIG. 9 shows a cross sectional view of a sequential manufacturing operation for a semiconductor device according to embodiments of the present disclosure.

Subsequently, one or more planarization operations are performed on stacked dielectric layers 62, 64 and 66. In some embodiments, a CMP operation is performed. FIG. 9 shows the result of the CMP operation. The CMP operation is controlled to stop on the hard mask layer 58 in the circuit area CA and the middle dielectric layer 64 in some embodiments. When the hard mask layer 58 and the middle dielectric layer 64 are made of the same material, for example, silicon nitride, the CMP operation stops at the hard mask layer 58 and the middle dielectric layer 64. As shown in FIG. 9, due to the topography caused by the underlying alignment mark 48, a part of the upper dielectric layer 66 remains in the concave portion of the middle dielectric layer above the underlying alignment mark 48. Since the upper surface of the middle dielectric layer 64 at the flat portion other than the memory structures and the underlying alignment mark 48 (a portion surrounding the underlying alignment mark 48) has a substantially equal height form the surface of the CMP stop layer 40 to the upper surface of the hard mask layer 58, the CMP operation stops at the substantially same height.

Figure 10:
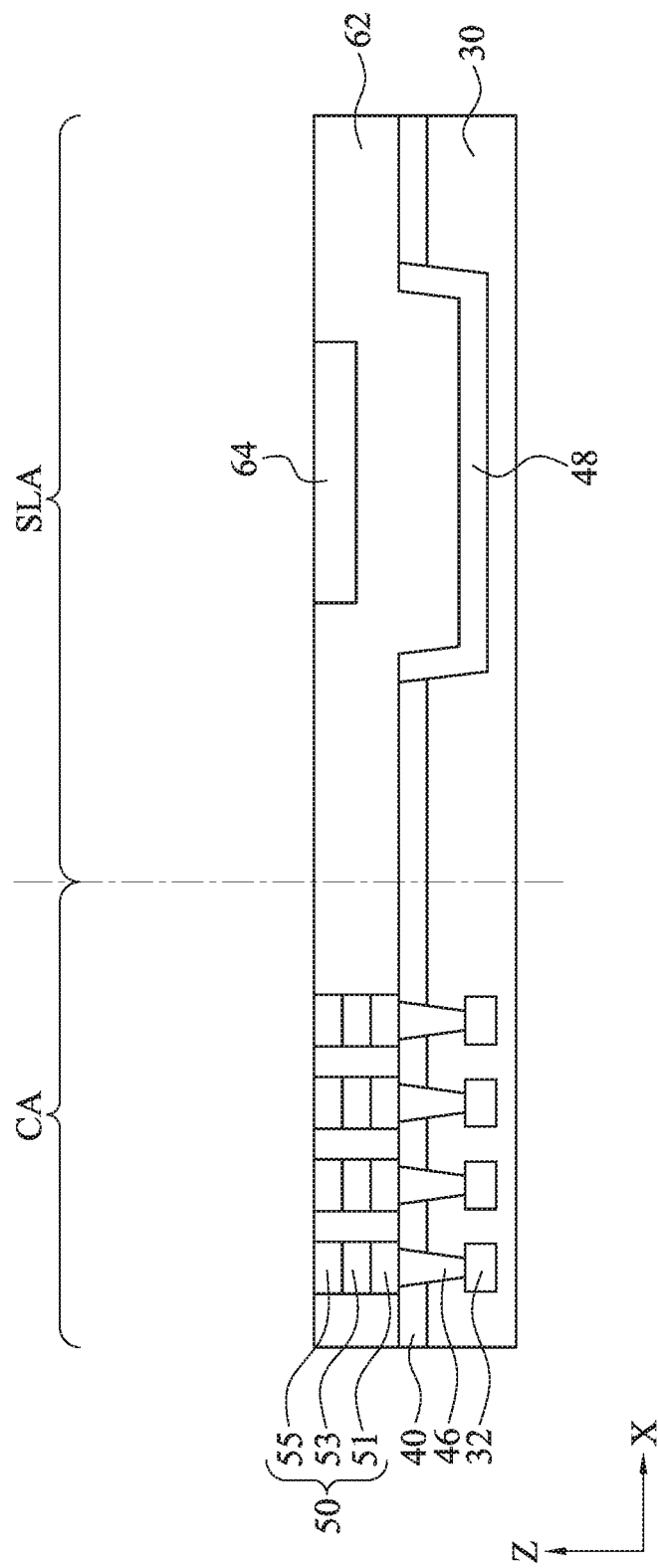
FIG. 10 shows a cross sectional view of a sequential manufacturing operation for a semiconductor device according to embodiments of the present disclosure.

After the CMP operation, an etch-back operation using plasma dry etching is performed to remove the hard mask layer 58, the remaining upper dielectric layer 68 and part of the middle dielectric layer, as shown in FIG. 10. As shown in FIG. 10, when the lowest portion of the middle dielectric layer 64 is below the upper surface of the third conductive layer, a part of the middle dielectric layer 64 remains at the concave portion of the lower dielectric layer 62 above the underlying alignment mark 48.

Subsequently, the remaining middle dielectric layer 64 is removed by a suitable etching operation. When the middle dielectric layer 64 is made of silicon nitride, the middle dielectric layer 64 can be selectively removed by a hot $H_3PO_4$ solution. After the remaining middle dielectric layer 64 is removed, a concave portion 70 formed by the lower dielectric layer 62 is obtained as an alignment mark. When the lower dielectric layer 62 is uniformly formed over the underlying alignment mark 48, which has been simultaneously formed by the operation of forming the via holes 46, the alignment mark 70 has the same position (e.g., the same center position) as the underlying alignment mark 48. Thus, the alignment mark 70 has the same relative location with respect to the via holes 46 as the underlying alignment mark 48, and the alignment mark 70 can be used as an alignment mark for subsequent lithography operations to align circuit patterns on a photo mask to the via holes 46.

Figure 11:
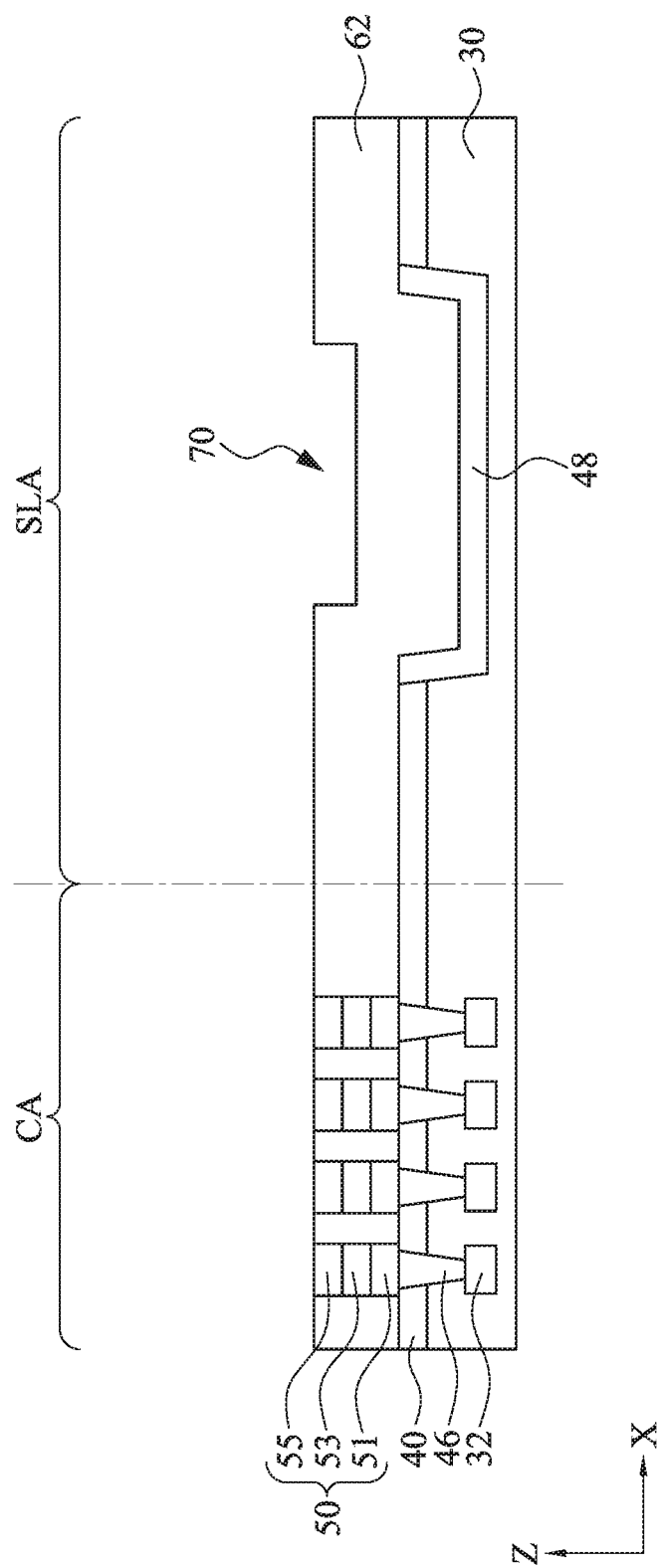
FIG. 11 shows a cross sectional view of a sequential manufacturing operation for a semiconductor device according to embodiments of the present disclosure.
Figure 12:
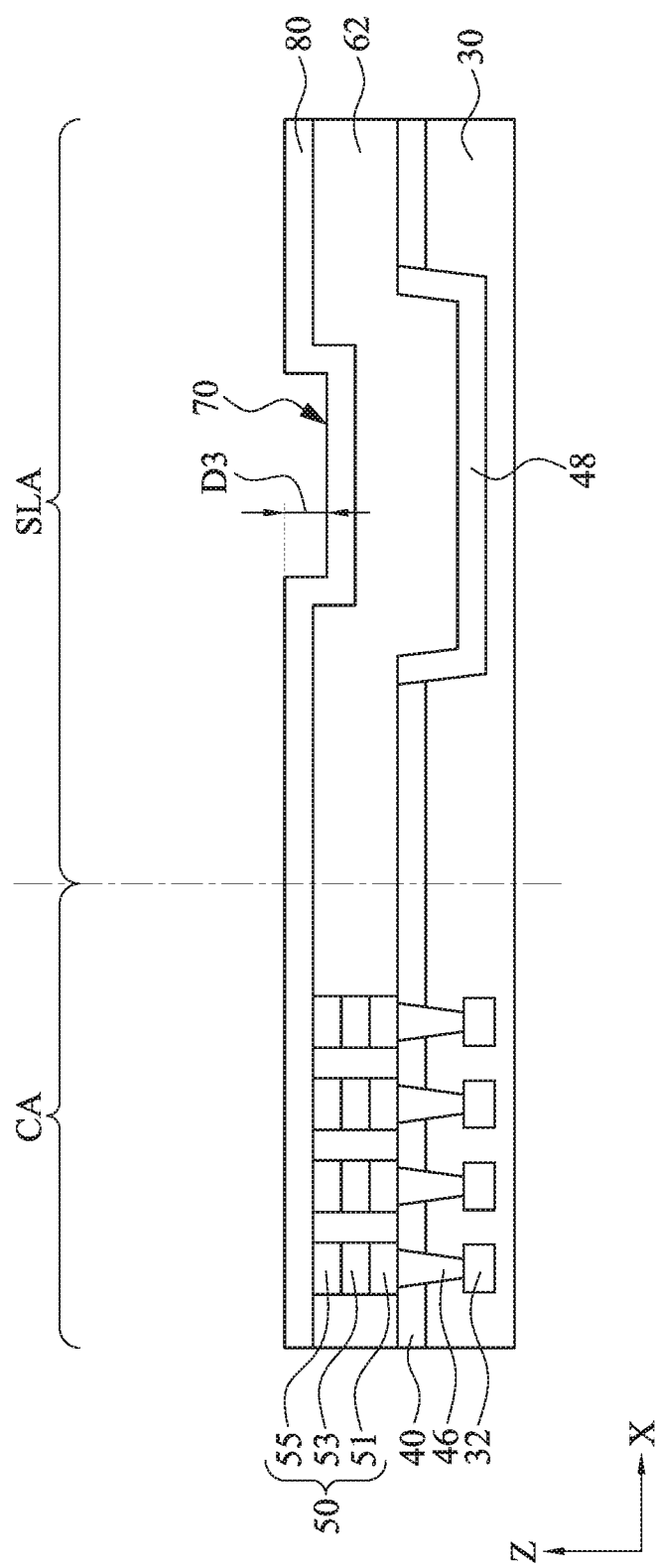
FIG. 12 shows a cross sectional view of a sequential manufacturing operation for a semiconductor device according to embodiments of the present disclosure.

FIG. 12 shows a structure in which a fourth conductive layer 80 is formed over the structure shown in FIG. 11. In some embodiments, the fourth conductive layer 80 is for bit lines for the memory device. In some embodiments, the fourth conductive layer 80 is made of Cu, W, Al, AlCu, Ti, Ta or alloy thereof. In certain embodiments, the fourth conductive layer 80 is made of W. The thickness of the fourth conductive layer 80 is in a range from about 40 nm to about 150 nm in some embodiments, and is in a range from about 50 nm to about 100 nm in other embodiments. In some embodiments, the depth D3 (step height) from the upper surface of the fourth conductive layer 80 to the center of the bottom part over the alignment mark 70 is in a range from about 20 nm to about 100 nm in some embodiments, and is in a range from about 30 nm to about 50 nm in other embodiments.

Figure 13:
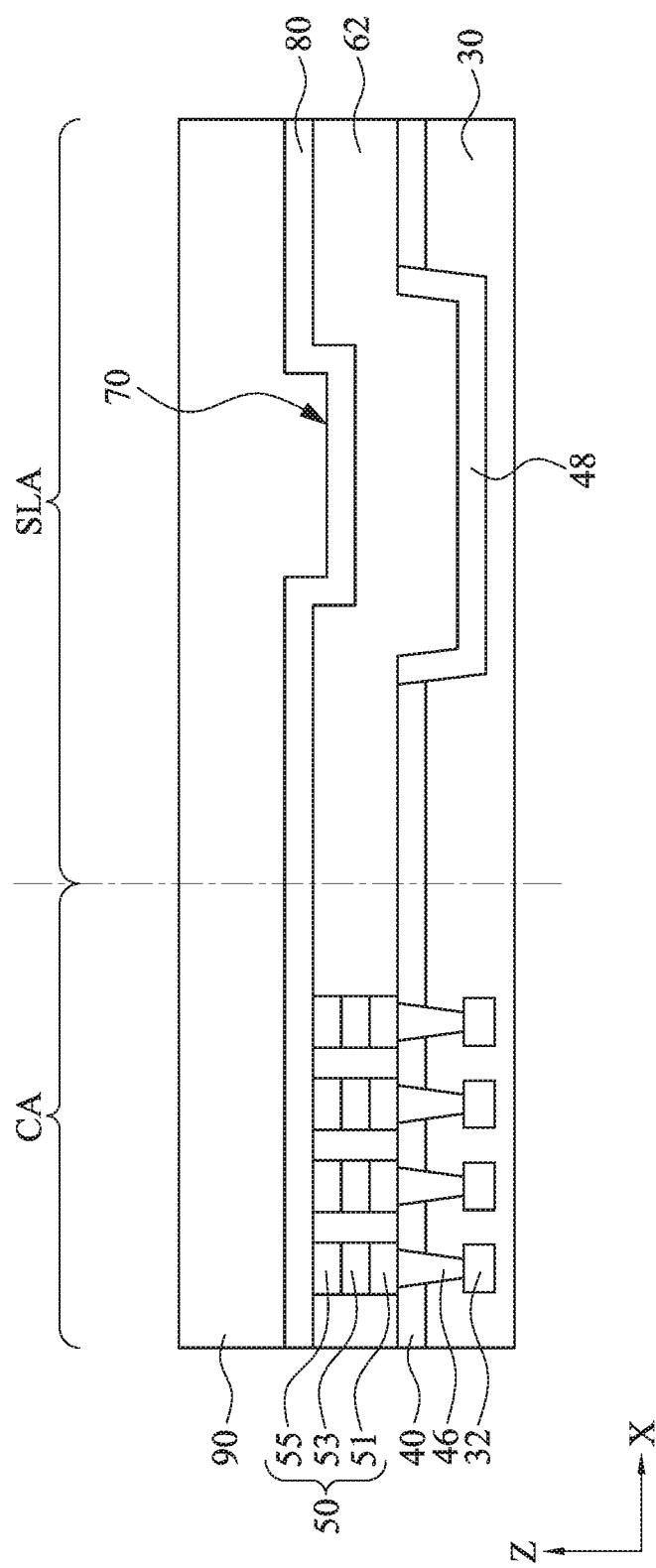
FIG. 13 shows a cross sectional view of a sequential manufacturing operation for a semiconductor device according to embodiments of the present disclosure.

After the fourth conductive layer 80 is formed, a photo resist layer 90 is formed over the fourth conductive layer 80 as shown in FIG. 13. Then, the resist coated substrate is loaded into a lithography apparatus and alignment operations using an alignment laser light is performed. The alignment operations detect the alignment mark 70 or the edges or the steps formed in the fourth conductive layer 80 corresponding to the steps of the alignment mark 70.

Tungsten or other metallic layers have a high reflectance with respect to the alignment laser light for the alignment system of the lithography apparatus. Thus, the alignment laser light may not reach the underlying alignment mark 48. According to the embodiments of the present disclosure, since there is a sufficient step in the fourth conductive layer 80 over the alignment mark 70, the alignment signal (reflected light) is strong enough to be detected.

Figure 14A:
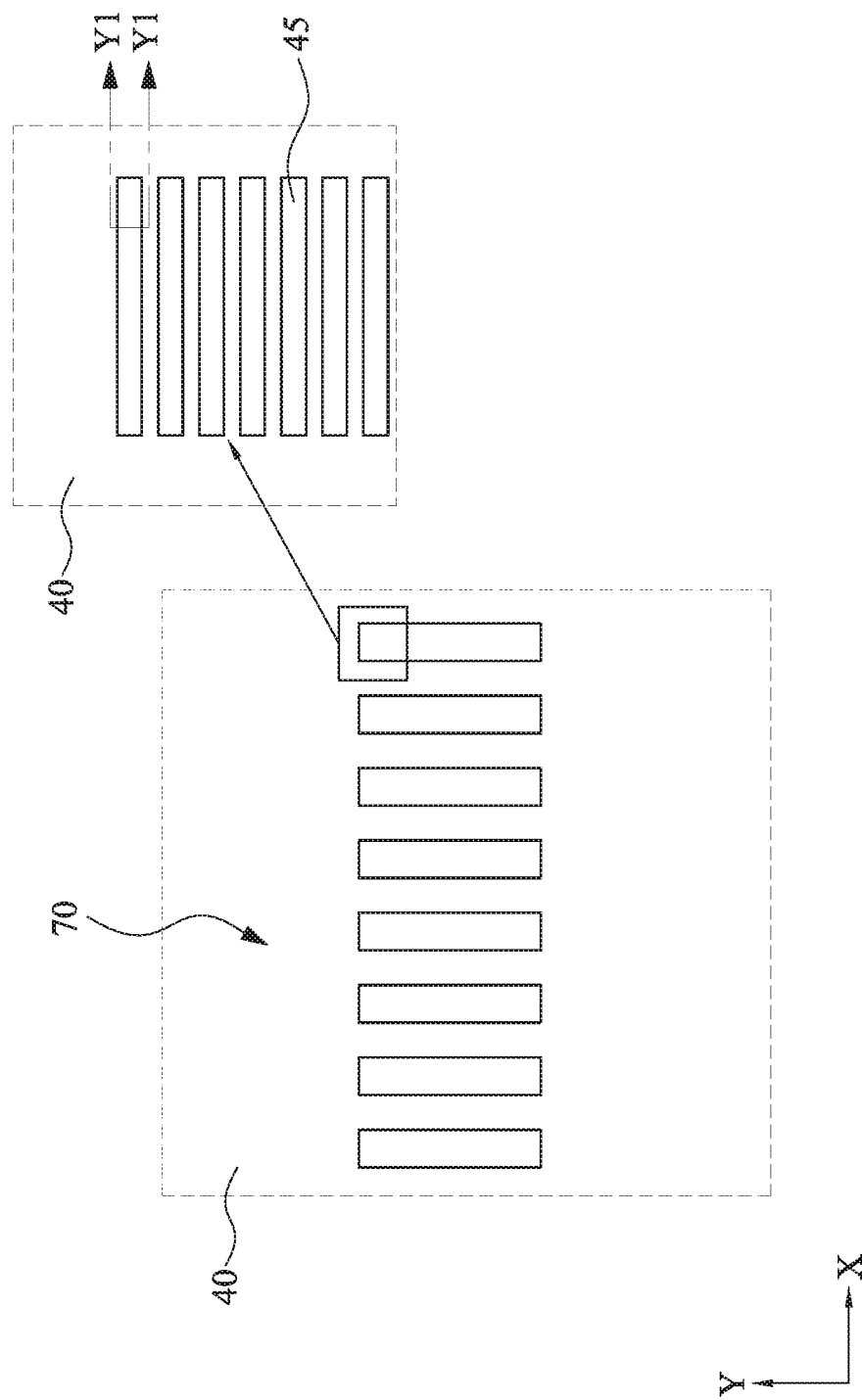
FIGS. 14A and 14B show alignment marks according to embodiments of the present disclosure.
Figure 14B:
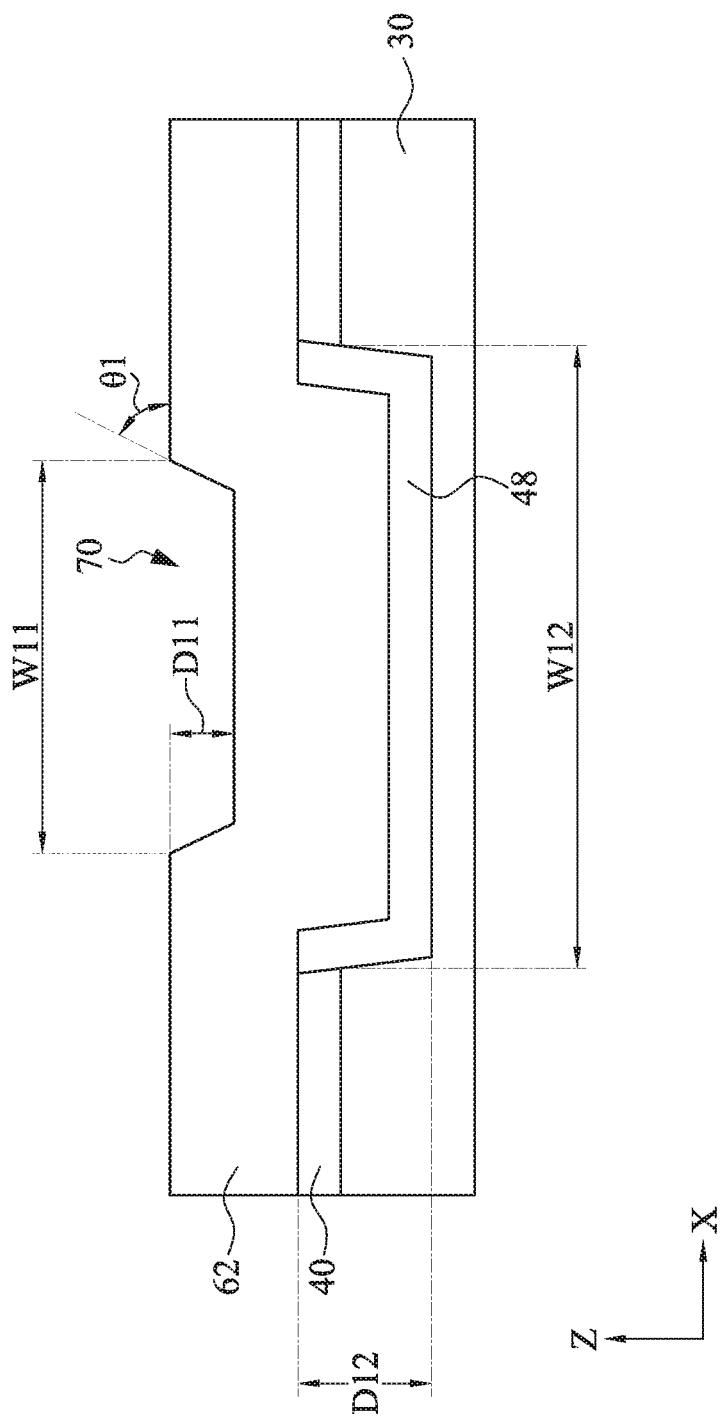

FIG. 14A shows a plan view of the alignment marks 70, and FIG. 14B shows an enlarged cross sectional view of the alignment marks 70 in some embodiments. In some embodiments, the alignment marks 70 includes groups of line and space patterns. The line and space patterns extend in the X direction and arranged in the Y direction, as shown in FIG.

14A. The overall shape of each of the groups is a rectangle and the multiple "rectangles" are arranged in the X direction, as shown in FIG. 14A. FIG. 14B shows a cross sectional view corresponding to line Y1-Y1 of FIG. 14A for one line pattern. In some embodiments, the alignment mark 70 formed by the lower dielectric layer has a U-shape cross section having a bottom part and side parts. Similarly, the underlying alignment mark 48 formed by the first conductive layer 45 has a U-shape cross section having a bottom part and sidewall parts.

The width W11, in particular, the minimum dimension of the alignment mark, depends on the alignment system of the lithography apparatus in some embodiments. The width W11 of the alignment mark 70 is in a range from about 0.1 µm to 1.0 µm in some embodiments, and is in a range from about 0.2 µm to 0.5 µm in other embodiments.

In some embodiments, the depth D11 from the upper surface of the lower dielectric layer 62 to the center of the bottom part of the alignment mark 70 is in a range from about 20 nm to about 100 nm in some embodiments, and is in a range from about 30 nm to about 50 nm in other embodiments. When the depth D11 (step height) is in these ranges, a sufficient alignment signal can be obtained, even after a reflective metallic layer 80 is formed. In some embodiments, the angle θ1 between the upper surface of the lower dielectric layer 62 and the sidewall of the alignment mark is in a range from about 50 degrees to about 90 degrees, and is in a range from about 60 degrees to 80 degrees in other embodiments.

The width W12 of the underlying alignment mark as the dimension of the trench opening is equal to or more than W11+2×total thickness of the second conductive layer 51, the memory layer 53 and the third conductive layer 55 in some embodiments. The width W12 of the underlying alignment mark 48 is in a range from about 0.2 µm to 1.5 µm in some embodiments, and is in a range from about 0.4 µm to 1.0 µm in other embodiments. In some embodiments, a depth D12 of the underlying alignment mark 48 measured at the center from the upper surface of the CMP stop layer 40 is in a range from about 10 nm to about 100 nm, and is in a range from about 30 nm to about 50 nm in other embodiments.

In the foregoing embodiments, the circuit area CA includes a memory device. However, the circuit area CA does not necessarily include a memory device, and can includes metal wirings for logic circuits.

Figure 15A:
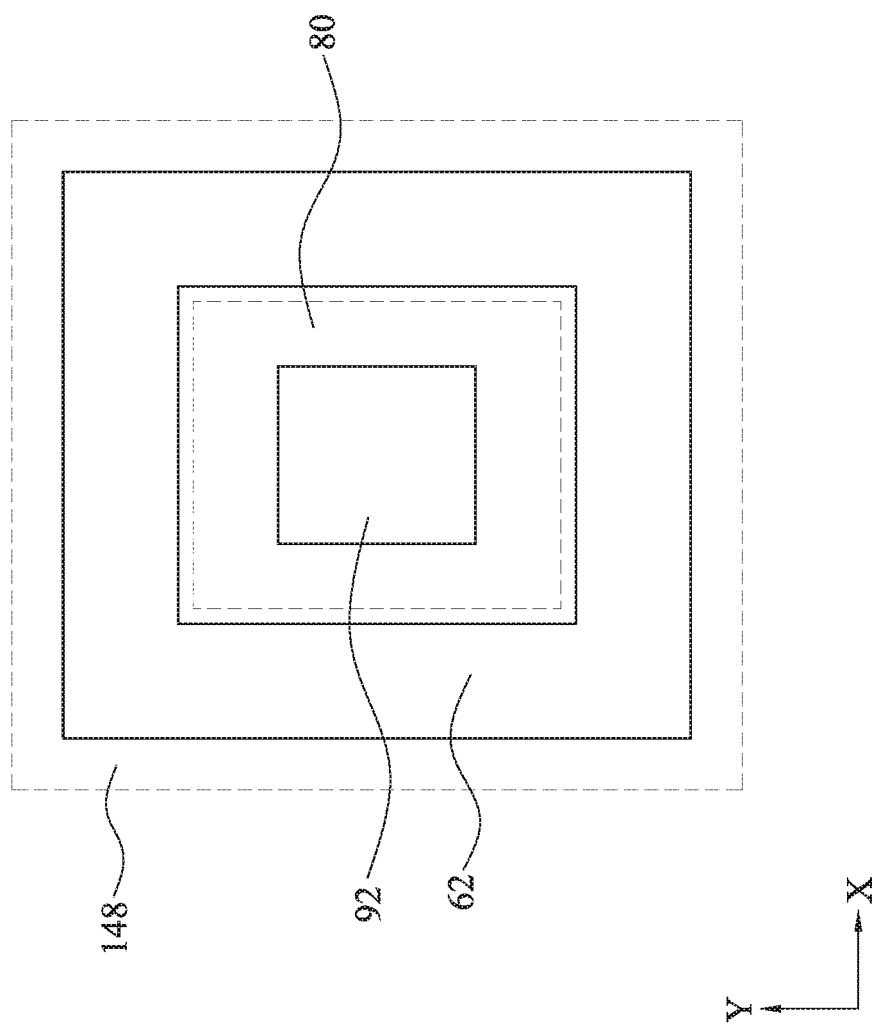
FIGS. 15A and 15B show overlay measurement marks according to embodiments of the present disclosure.
Figure 15B:
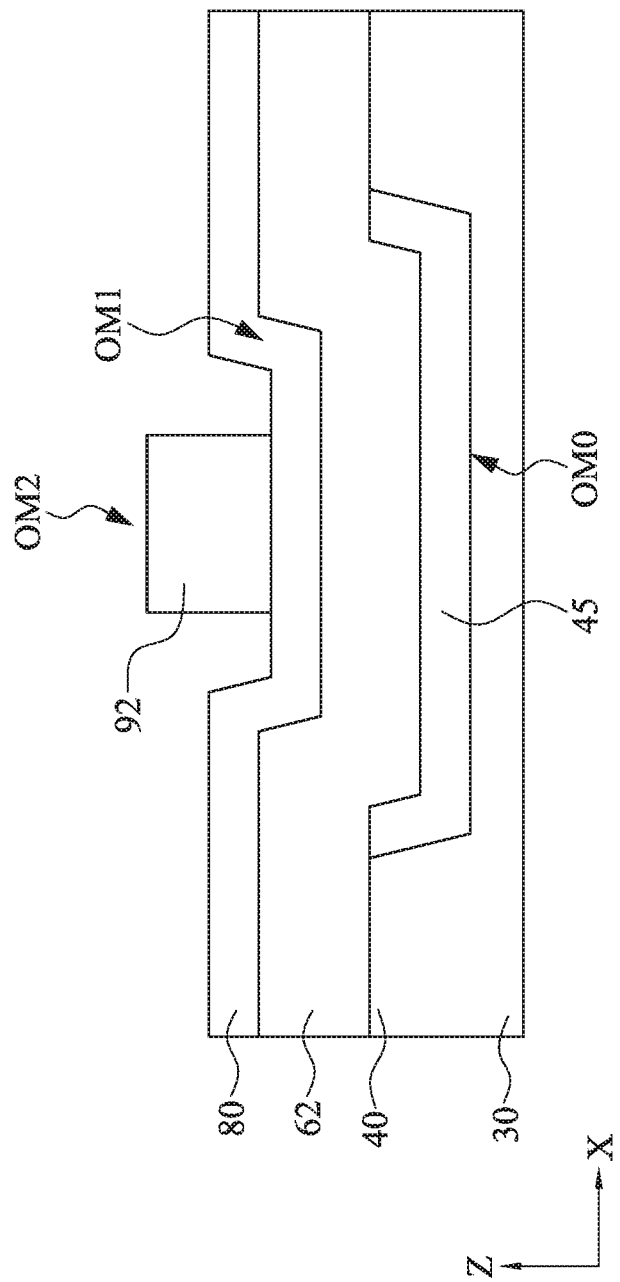

FIG. 15A is a plan view and FIG. 15B is a cross sectional view of an overlay measurement pattern according to an embodiment of the present disclosure. Materials, configurations, dimensions, processes, and/or operations the same as or similar to those explained with respect to FIGS. 1-14B may be employed in the following embodiments, and the detailed explanation thereof may be omitted.

The aforementioned technique can be applied not only to alignment marks but also to overlay measurement marks. In some embodiments, a lower overlay measurement mark OM1 is formed by a concave portion of the lower dielectric layer 62, and an upper overlay measurement mark OM2 is formed by a photo resist pattern 92 on the fourth conductive layer 80. The lower overlay measurement mark OM1 is formed over and aligned with the underlying overlay measurement mark OM0 formed by the first conductive layer 45. By measuring edges of the lower overlay measurement pattern OM1 and the upper overlay measurement pattern OM2, a relative distance between the lower overlay measurement pattern OM1 and the upper overlay measurement pattern OM2 is obtained as an overlay error. Since the lower overlay measurement pattern OM1 has a sufficient step height as set forth above, signals from the lower overlay measurement pattern OM1 are strong and/or include less noise. Accordingly, more accurate overlay measurement is possible.

In the embodiments of the present disclosure, an alignment mark having a sufficient step (edge) height is obtained in a reflective metallic layer over an interlayer dielectric layer. Accordingly, a stronger alignment signal can be obtained and thus alignment accuracy can be improved. Further, when a semiconductor manufacturing operation includes forming an oxide-nitride-oxide stacked layer (e.g., layers 62, 64 and 66), an alignment mark having a sufficient step (edge) height is obtained without an additional lithography operation.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a first interlayer dielectric (ILD) layer is formed over a substrate, a chemical mechanical polishing (CMP) stop layer is formed over the first ILD layer, a trench opening is formed by patterning the CMP stop layer and the first ILD layer, an underlying first process mark is formed by forming a first conductive layer in the trench opening, a lower dielectric layer is formed over the underlying first process mark, a middle dielectric layer is formed over the lower dielectric layer, an upper dielectric layer is formed over the middle dielectric layer, a planarization operation is performed on the upper, middle and lower dielectric layers so that a part of the middle dielectric layer remains over the underlying first process mark, and a second process mark by the lower dielectric layer is formed by removing the remaining part of the middle dielectric layer. In one or more of the foregoing and following embodiments, the second process mark includes at least one of an alignment mark and an overlay measurement mark. In one or more of the foregoing and following embodiments, the lower and upper dielectric layers include silicon oxide and the middle dielectric layer includes silicon nitride. In one or more of the foregoing and following embodiments, the second process mark is an alignment mark, and further a second conductive layer is formed over the alignment mark, a photo resist layer is formed over the second conductive layer, and the alignment mark or an edge or a step formed by the second conductive layer above an edge of the alignment mark is detected to perform a lithography operation. In one or more of the foregoing and following embodiments, the second conductive layer includes W. In one or more of the foregoing and following embodiments, the second process mark has a step height in a range from 20 nm to 100 nm. In one or more of the foregoing and following embodiments, the planarization operation includes a chemical mechanical polishing (CMP) operation followed by an etch-back operation. In one or more of the foregoing and following embodiments, the CMP operation is performed such that a part of the upper dielectric layer remains over the underlying first process mark and an upper surface of a part of the middle dielectric layer surrounding the underlying first process mark is exposed. In one or more of the foregoing and following embodiments, the CMP stop layer includes at least one of silicon-rich oxide and silicon carbide.

In accordance with another aspect of the present disclosure, in a method of manufacturing a semiconductor device, a first interlayer dielectric (ILD) layer is formed over a substrate, a chemical mechanical polishing (CMP) stop layer is formed over the first ILD layer, a trench opening is formed in a peripheral area and a via opening is formed in a circuit area by patterning the CMP stop layer and the first ILD layer, an underlying first process mark is formed in the peripheral area and a via contact is formed in the circuit area by forming a first conductive layer in the trench opening and the via opening, respectively, a memory structure is formed over the via contact, a lower dielectric layer is formed over the underlying first process mark and the memory structure, a middle dielectric layer is formed over the lower dielectric layer, an upper dielectric layer is formed over the middle dielectric layer, a planarization operation is performed on the upper, middle and lower dielectric layers so that a part of the middle dielectric layer remains over the underlying first process mark, and a second process mark by the lower dielectric layer is formed by removing the remaining part of the middle dielectric layer. In one or more of the foregoing and following embodiments, the planarization operation includes a CMP operation followed by an etch-back operation. In one or more of the foregoing and following embodiments, the memory structure includes a memory stack and a hard mask layer disposed on the memory stack layer, and the CMP operation stops when the hard mask layer is exposed. In one or more of the foregoing and following embodiments, the lower dielectric layer and the middle dielectric layer have thicknesses such that an upper surface of the middle dielectric layer in the peripheral area other than the underlying first process mark is substantially equal to an upper surface of the hard mask layer. In one or more of the foregoing and following embodiments, the memory stack includes a lower conductive layer, a memory layer over the lower conductive layer and an upper conductive layer over the memory layer, and the etch-back operation is performed so that the upper conductive layer is exposed and the part of the middle dielectric layer remains over the underlying first process mark. In one or more of the foregoing and following embodiments, the second process mark includes an alignment mark, and further a second conductive layer is formed over the alignment mark and the exposed upper conductive layer, a photo resist layer is formed over the second conductive layer, and the alignment mark or an edge or a step formed by the second conductive layer above an edge of the alignment mark is detected to perform a lithography operation. In one or more of the foregoing and following embodiments, a height of the step is in a range from 20 nm to 100 nm. In one or more of the foregoing and following embodiments, the memory layer includes at least one of a phase change material layer and a resistive change material layer. In one or more of the foregoing and following embodiments, the lower dielectric layer has a thickness such that a bottom surface of the middle dielectric layer above the underlying first process mark is below an upper surface of the upper conductive layer. In one or more of the foregoing and following embodiments, the lower and upper dielectric layers include silicon oxide and the middle dielectric layer includes silicon nitride.

In accordance with another aspect of the present disclosure, a semiconductor device includes a metal wiring layer embedded in a first interlayer dielectric (ILD) layer over a substrate, a via contact formed by a metal layer and disposed on the metal wiring layer, a memory structure over the via contact, an underlying alignment mark formed by the metal layer disposed in a trench formed in the first ILD layer, a second ILD layer over the first ILD layer and the underlying alignment mark, and an alignment mark formed at a surface of the second ILD layer over the underlying alignment mark and having a step.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first interlayer dielectric (ILD) layer over a substrate;
    forming a chemical mechanical polishing (CMP) stop layer over the first ILD layer;
    forming a trench opening by patterning the CMP stop layer and the first ILD layer;
    forming an underlying first process mark by forming a first conductive layer in the trench opening;
    forming a lower dielectric layer over the underlying first process mark;
    forming a middle dielectric layer over the lower dielectric layer;
    forming an upper dielectric layer over the middle dielectric layer;
    performing a planarization operation on the upper, middle and lower dielectric layers so that a part of the middle dielectric layer remains over the underlying first process mark; and
    forming a second process mark by the lower dielectric layer by removing the remaining part of the middle dielectric layer.

2. The method of claim 1, wherein the second process mark includes at least one of an alignment mark and an overlay measurement mark.

3. The method of claim 2, wherein the lower and upper dielectric layers include silicon oxide and the middle dielectric layer includes silicon nitride.

4. The method of claim 2, wherein:
    the second process mark is an alignment mark, and
    the method further comprises:
        forming a second conductive layer over the alignment mark;
        forming a photo resist layer over the second conductive layer; and
        detecting the alignment mark or an edge or a step formed by the second conductive layer above an edge of the alignment mark to perform a lithography operation.

5. The method of claim 4, wherein the second conductive layer includes W.

6. The method of claim 1, wherein the second process mark has a step height in a range from 20 nm to 100 nm.

7. The method of claim 1, wherein the planarization operation includes a CMP operation followed by an etch-back operation.

8. The method of claim 7, wherein the CMP operation is performed such that a part of the upper dielectric layer remains over the underlying first process mark and an upper surface of a part of the middle dielectric layer surrounding the underlying first process mark is exposed.

9. The method of claim 1, wherein the CMP stop layer includes at least one of silicon-rich oxide and silicon carbide.

10. A method of manufacturing a semiconductor device, comprising:
    forming a first interlayer dielectric (ILD) layer over a substrate;
    forming a chemical mechanical polishing (CMP) stop layer over the first ILD layer;
    forming a trench opening in a peripheral area and a via opening in a circuit area by patterning the CMP stop layer and the first ILD layer;
    forming an underlying first process mark in the peripheral area and a via contact in the circuit area by forming a first conductive layer in the trench opening and the via opening, respectively;
    forming a memory structure over the via contact;
    forming a lower dielectric layer over the underlying first process mark and the memory structure;
    forming a middle dielectric layer over the lower dielectric layer;
    forming an upper dielectric layer over the middle dielectric layer;
    performing a planarization operation on the upper, middle and lower dielectric layers so that a part of the middle dielectric layer remains over the underlying first process mark; and
    forming a second process mark by the lower dielectric layer by removing the remaining part of the middle dielectric layer.

11. The method of claim 10, wherein the planarization operation includes a CMP operation followed by an etch-back operation.

12. The method of claim 11, wherein:
    the memory structure includes a memory stack and a hard mask layer disposed on the memory stack layer, and
    the CMP operation stops when the hard mask layer is exposed.

13. The method of claim 12, wherein the lower dielectric layer and the middle dielectric layer have thicknesses such that an upper surface of the middle dielectric layer in the peripheral area other than the underlying first process mark is substantially equal to an upper surface of the hard mask layer.

14. The method of claim 11, wherein:
    the memory stack includes a lower conductive layer, a memory layer over the lower conductive layer and an upper conductive layer over the memory layer, and
    the etch-back operation is performed so that the upper conductive layer is exposed and the part of the middle dielectric layer remains over the underlying first process mark.

15. The method of claim 14, wherein:
    the second process mark includes an alignment mark,
    the method further comprises:
        forming a second conductive layer over the alignment mark and the exposed upper conductive layer;
        forming a photo resist layer over the second conductive layer; and
        detecting the alignment mark or an edge or a step formed by the second conductive layer above an edge of the alignment mark to perform a lithography operation.

16. The method of claim 15, wherein a height of the step is in a range from 20 nm to 100 nm.

17. The method of claim 14, wherein the memory layer includes at least one of a phase change material layer and a resistive change material layer.

18. The method of claim 14, wherein the lower dielectric layer has a thickness such that a bottom surface of the middle dielectric layer above the underlying first process mark is below an upper surface of the upper conductive layer.

19. The method of claim 10, wherein the lower and upper dielectric layers include silicon oxide and the middle dielectric layer includes silicon nitride.

20. A method of manufacturing a semiconductor device, comprising:
    forming a first dielectric layer over a substrate;
    forming a trench opening by patterning the first dielectric layer;
    forming an underlying first process mark by forming a first conductive layer in the trench opening;
    forming a lower dielectric layer over the underlying first process mark;
    forming a middle dielectric layer over the lower dielectric layer;
    forming an upper dielectric layer over the middle dielectric layer;
    performing a planarization operation on the upper, middle and lower dielectric layers so that a part of the middle dielectric layer remains over the underlying first process mark; and
    forming a second process mark by the lower dielectric layer by removing the remaining part of the middle dielectric layer.

* * * * *